United States Patent [19]

Mori

[11] Patent Number: 5,049,514
[45] Date of Patent: Sep. 17, 1991

[54] METHOD OF MAKING A MOS DEVICE HAVING A POLYCIDE GATE

[75] Inventor: Seiichi Mori, Tokyo, Japan

[73] Assignee: Kabushiki Kaisha Toshiba, Kawasaki, Japan

[21] Appl. No.: 466,924

[22] Filed: Jan. 18, 1990

[30] Foreign Application Priority Data

Jan. 20, 1989 [JP] Japan ................................. 1-11624

[51] Int. Cl.$^5$ .......................................... H01L 21/336
[52] U.S. Cl. ..................................... 437/41; 437/200;
 437/45; 437/941; 148/DIG. 147; 148/DIG. 19
[58] Field of Search ................. 437/41, 200, 56, 57,
 437/45, 941; 148/DIG. 19, DIG. 20, DIG. 147;
 357/67 S, 71 S, 23.13

[56] References Cited

U.S. PATENT DOCUMENTS

| 4,551,908 | 11/1985 | Nagakawa et al. | 148/DIG. 19 |
| 4,558,507 | 12/1985 | Okabayashi et al. | 148/DIG. 19 |
| 4,740,479 | 4/1988 | Neppl et al. | 437/200 |
| 4,788,160 | 11/1988 | Havemann et al. | 437/200 |
| 4,859,278 | 8/1989 | Choi | 156/643 |

FOREIGN PATENT DOCUMENTS

| 2406302 | 5/1979 | France . | |
| 0100768 | 6/1982 | Japan | 437/941 |
| WO87/00967 | 2/1987 | PCT Int'l Appl. . | |

OTHER PUBLICATIONS

Murarka, S. P., *Silicides for VLSI Applications*, Academic Press, TK7871.15.S54M8, 1982, pp. 30–31, 116–119.
Eurpoean Search Report, 90100301.2.

Primary Examiner—Brian E. Hearn
Assistant Examiner—T. N. Quach
Attorney, Agent, or Firm—Banner, Birch, McKie & Beckett

[57] ABSTRACT

In a method of manufacturing a semiconductor device of polycide gate structure, a polysilicon layer is formed on the gate insulation film. The polysilicon layer and the gate insulation film are selectively removed to form an opening which reaches the semiconductor substrate in the polysilicon layer and the gate insulation film. After this, a silicide film is formed directly on the polysilicon layer and an exposed part of the semiconductor substrate and then ion-implantation is effected to form source and drain regions. According to the manufacturing method, since the silicide film is formed in direct contact with the semiconductor substrate, charges caused by the ion-implantation can be easily discharged into the semiconductor substrate. Therefore, no gate charge will occur. Further, the gate oxide film is prevented from being brought into contact with the masking photoresist layer by the presence of the polysilicon layer. Therefore, damage of the surface of the gate oxide film due to the direct contact with the photoresist layer will not occur and unwanted material may be prevented from being injected from the photoresist layer into the gate oxide film.

18 Claims, 5 Drawing Sheets

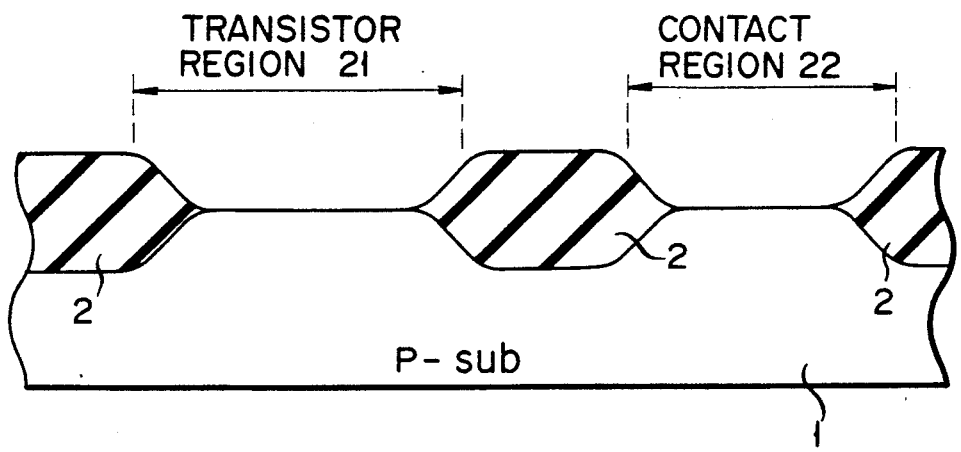
F I G. 1A
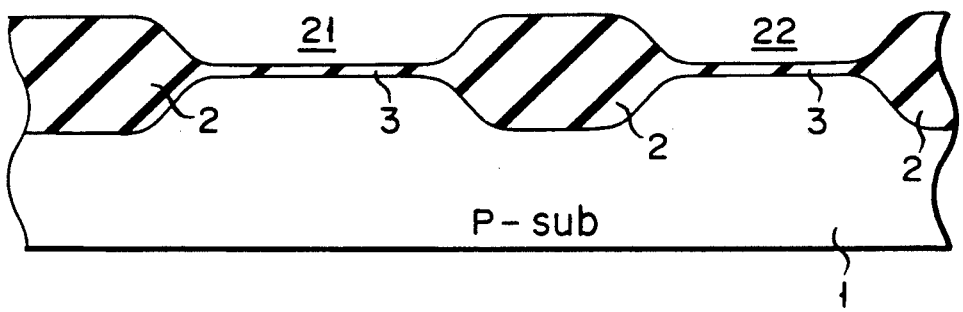
F I G. 1B
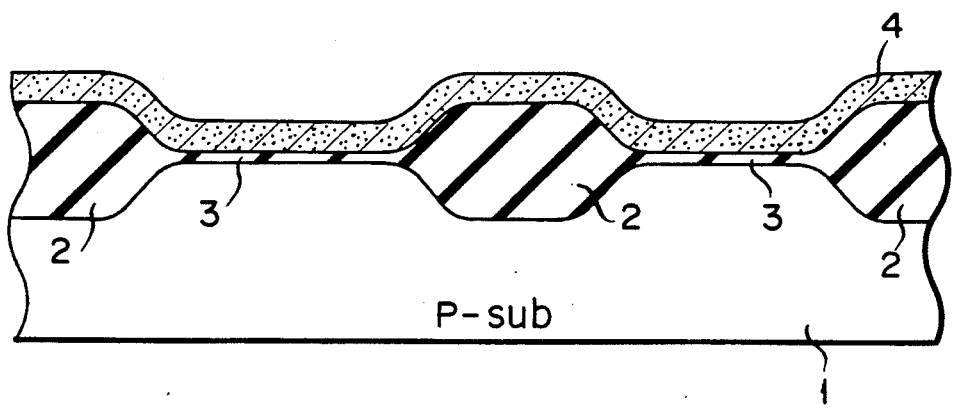
F I G. 1C

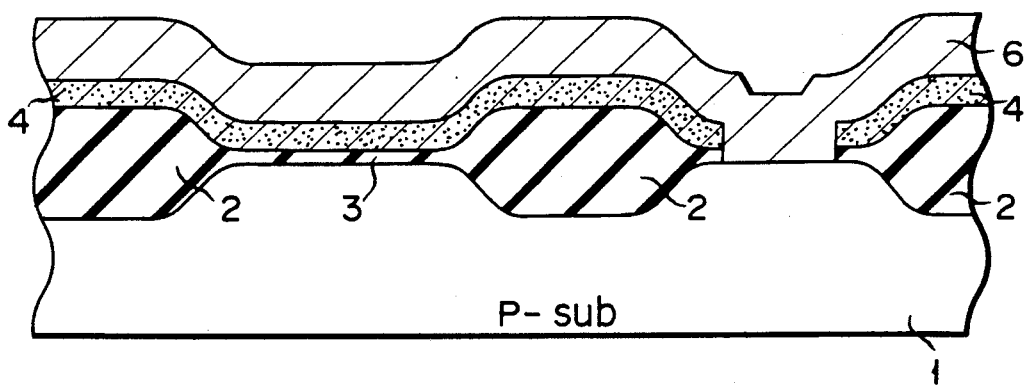
F I G. 1G
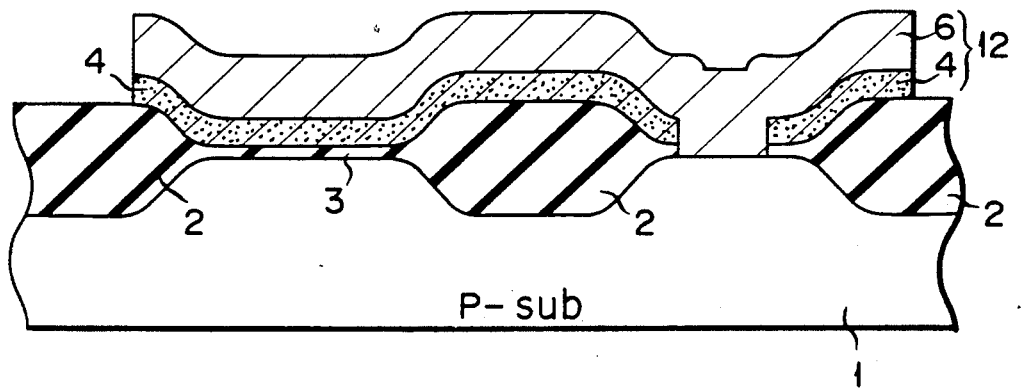
F I G. 1H
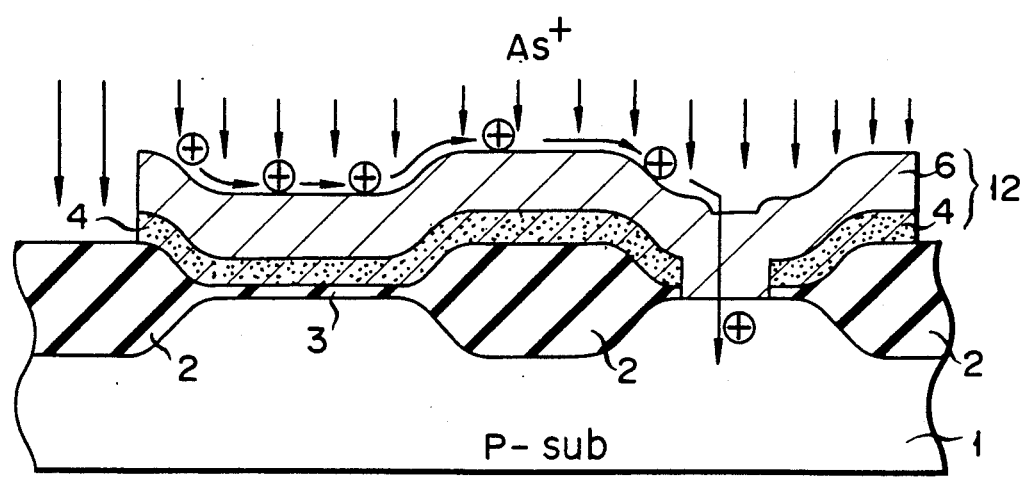
F I G. 1I

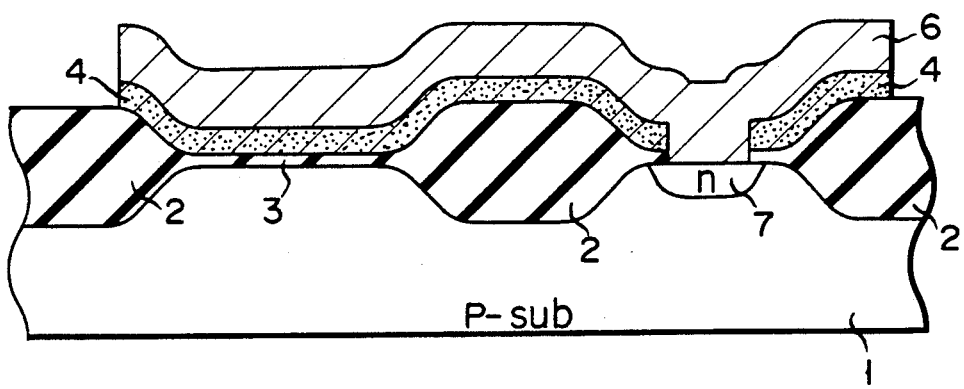
F I G. 1J
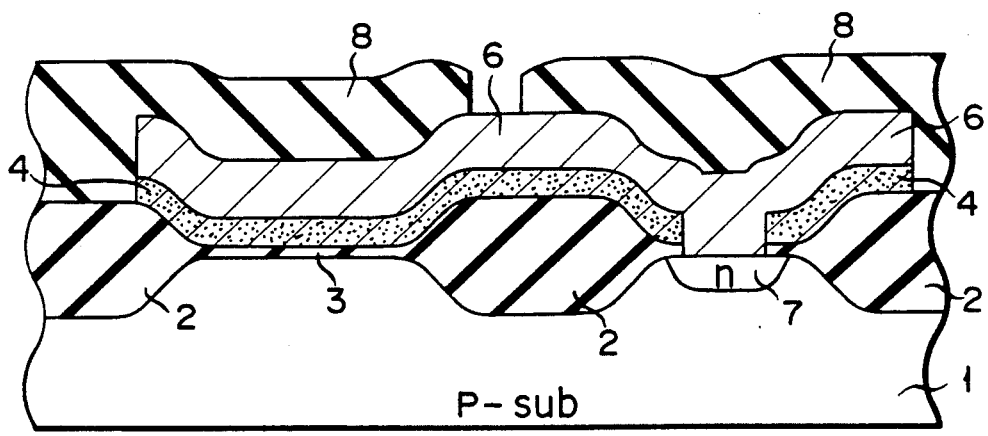
F I G. 1K
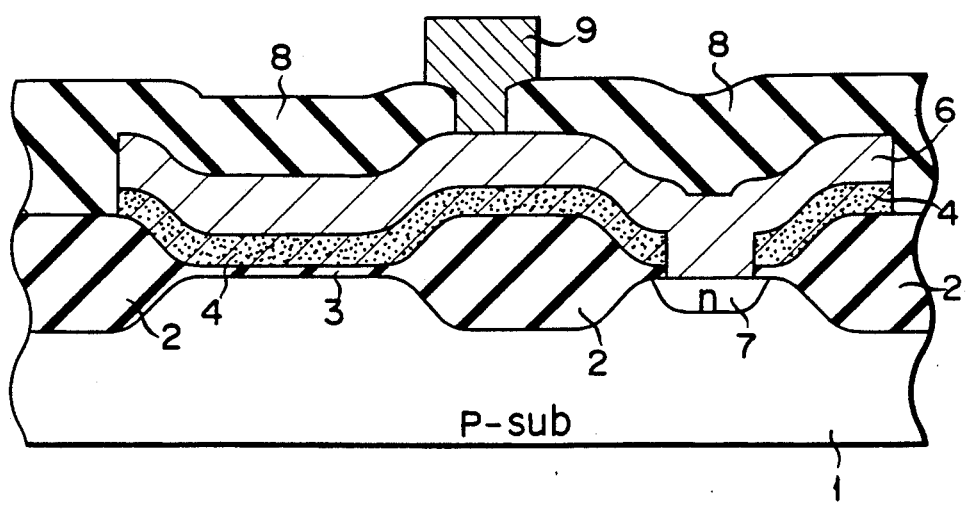
F I G. 1L

METHOD OF MAKING A MOS DEVICE HAVING A POLYCIDE GATE

BACKGROUND OF THE INVENTION

1. Field of the Invention

This invention relates to a method for manufacturing semiconductor devices of polycide gate structure, and more particularly to a method used for manufacturing semiconductor devices having a thin gate oxide film.

2. Description of the Related Art

In a MOS transistor manufacturing process, semiconductor impurity is ion-implanted into a semiconductor substrate to form source and drain regions. At this time, charges caused by the ion-implantation are injected into the gate electrode so as to charge the gate electrode (gate charge). The gate charging increases the potential of the gate electrode so that the gate oxide film may be subject to dielectric breakdown by the electric field created between the substrate and the gate electrode when the gate oxide film is thin. In order to solve this problem, the ion-implantation is generally effected with the gate electrode layer and the silicon substrate held in contact with each other. With the gate electrode layer kept in contact with the silicon substrate, charges caused by the ion-implantation will not be stored in the gate electrode but discharged into the substrate.

In order to set the gate electrode layer in contact with the silicon substrate, it is necessary to remove the contact portion of the gate electrode layer by the photolithographic process, for example, and form a contact hole for connection with the gate oxide film. In the process of forming the contact hole, a photoresist film of a predetermined pattern is formed on the thin gate oxide film and the gate oxide film is selectively etched to form the contact hole using the resist film as a mask. However, formation of the photoresist layer on the thin gate oxide film may significantly degrade the quality of the surface of the gate oxide film and increase the weak-point density. Further, material mixed into the photoresist layer may be injected into the gate oxide film to lower the electrical stability of the gate oxide film.

As described above, in the conventional manufacturing method, there are problems that the gate oxide film may be damaged in the manufacturing process and unwanted material will be injected into the gate oxide film.

SUMMARY OF THE INVENTION

This invention has been made in view of the above fact and an object of this invention is to provide a semiconductor device manufacturing method capable of suppressing the gate charge at the time of ion-implantation and preventing occurrence of damage to the gate oxide film in the manufacturing process and injection of unwanted material into the gate oxide film.

In order to achieve the above object, the semiconductor device manufacturing method of this invention comprises the steps of forming a gate insulation film on a semiconductor substrate; and forming a polysilicon layer on the gate insulation film. The polysilicon layer and the gate insulation film are selectively removed to form an opening which reaches the semiconductor substrate in the polysilicon layer and the gate insulation film. After this, a silicide film is formed directly on the polysilicon layer and an exposed part of the semiconductor substrate and then ion-implantation is effected to form source and drain regions.

According to the above method cf this invention, since the silicide film is formed in direct contact with the semiconductor substrate, charges caused by the ion-implantation can be easily discharged into the semiconductor substrate. Therefore, no gate charge will occur. Further, the gate oxide film is prevented from being brought into contact with the photoresist layer by the presence of the polysilicon layer. Therefore, damage of the surface of the gate oxide film due to the direct contact with the photoresist layer will not occur and unwanted material may be prevented from being injected from the photoresist layer into the gate oxide film.

In a case where the withstanding voltage of the contact portion between the silicide layer and the semiconductor substrate is lower than that of the gate and the substrate of the transistor, portions of the silicide layer and the polysilicon layer which lie between the transistor region and the contact region are selectively removed so as to separate a region acting as the gate electrode portion from the semiconductor substrate. As a result, it becomes unnecessary to set the upper limit of the operation voltage range of the semiconductor device lower than the withstanding voltage of the contact portion.

BRIEF DESCRIPTION OF THE DRAWINGS

FIGS. 1A to 1L are cross sectional views of semiconductor structures in respective steps of a manufacturing method according to one embodiment of this invention.

DETAILED DESCRIPTION OF THE PREFERRED EMBODIMENTS

Figure 1D:
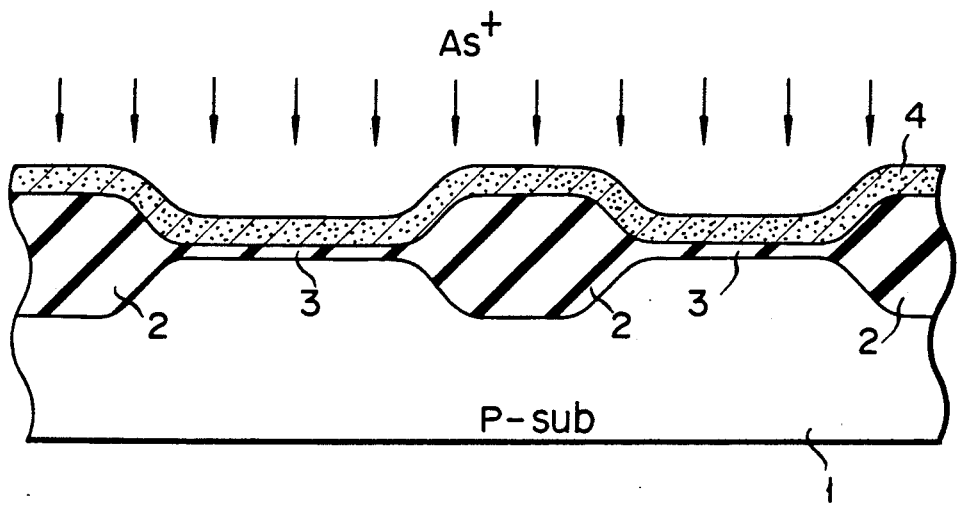

There will now be described a manufacturing method according to an embodiment of this invention with reference to the accompanying drawings.

This embodiment is made by applying the manufacturing method of this invention to a method for manufacturing a semiconductor device having transistor elements.

FIGS. 1A to 1L are cross sectional views of semiconductor structures in respective steps of a manufacturing method according to the embodiment of this invention. The cross sectional views show the cross sections taken along lines extending in the lengthwise direction of the gate electrode of the transistor element and therefore the source and drain regions are not shown.

As shown in FIG. 1A, an element isolation region (SiO$_2$ region) 2 is formed in a p-type silicon substrate 1 by the thermal oxidation method.

After this, as shown in FIG. 1B, a thin oxide film (SiO$_2$ film) 3 with a film thickness of 100 Å, for example, is formed by the thermal oxidation method on a transistor region 21 and a contact area 22 which are isolated from the element isolation regions 2. Part of the oxide film 3 which lies on the transistor region 21 constitutes a gate oxide film.

Then, as shown in FIG. 1C, a polysilicon layer 4 is formed by the CVD method to a thickness of approx. 1500 Å.

After this, as shown in FIG. 1D, n-type impurity such as As$^+$ is ion-implanted into the polysilicon layer 4 to enhance the electrical conductivity thereof.

Instead of the As+ implantation, phosphorus may be diffused into the polysilicon layer 4. In the As+ ion-implantation performed during this step, a charge-up will not occur in the polysilicon layer 4, since the polysilicon layer 4 is generally connected to the ground during the ion-implantation step via the conductive wafer-holder (not shown) of an ion-implanting device (not shown), for holding the semiconductor wafer (the semiconductor structure), the wafer-holder generally being grounded.

Figure 1E:
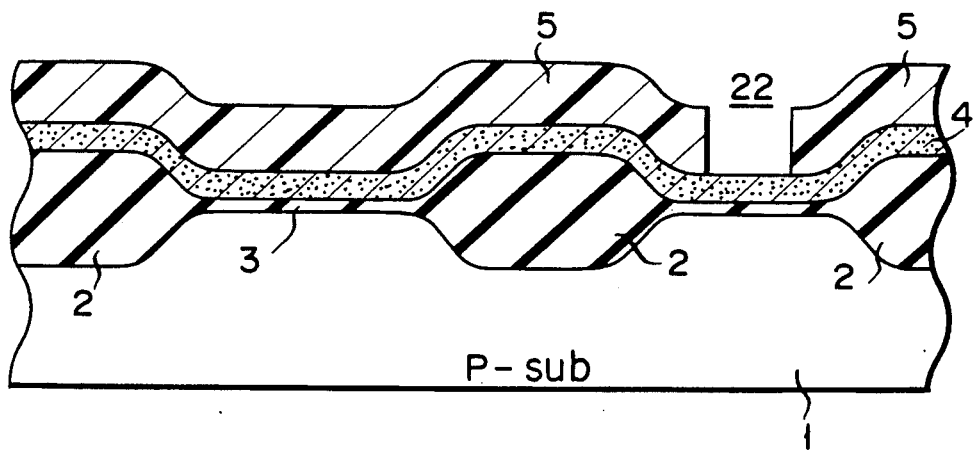

Next, as shown in FIG. 1E, a photoresist layer 5 is formed on the polysilicon layer 4 and then patterned to form an opening in the contact area.

Figure 1F:
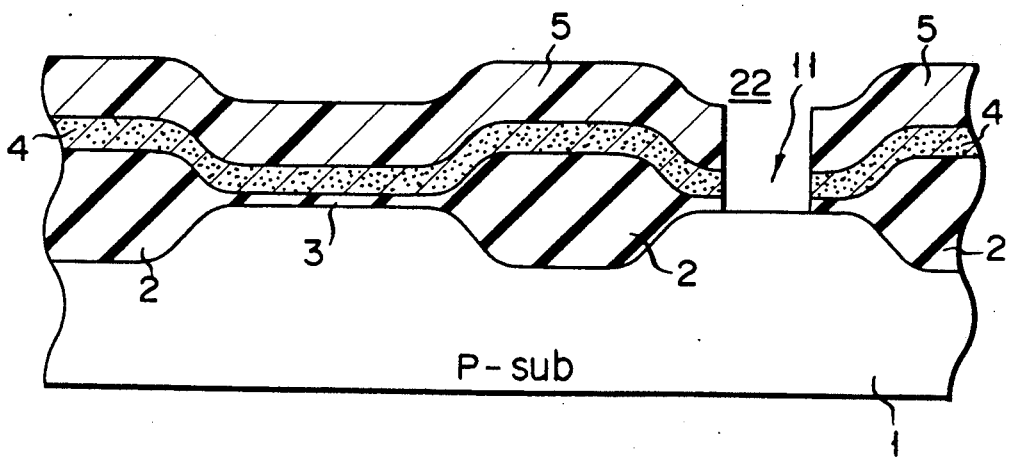

With the photoresist film 5 used as a mask, the polysilicon layer 4 and the gate oxide film 3 are selectively etched to form an opening 11 which reaches the substrate in the contact area 22 as shown in FIG. 1F.

After this, the photoresist layer 5 is removed, and as shown in FIG. 1G, a metal silicide layer such as a tungsten silicide (WSi) layer 6 is formed to a thickness of approx. 3000 Å by the CVD method. The silicide layer 6 is formed to extend into the opening 11 so as to be made in contact with the exposed portion of the substrate.

Then, as shown in FIG. 1H, the metal silicide layer and polysilicon layer 4 are patterned to form a polycide gate electrode 12 of a predetermined pattern.

Next, as shown in FIG. 1I, for example, As+ is ion-implanted to an impurity density of $1 \times 10^{15}$ cm$^{31\ 2}$, for example, as an n-type impurity source used for forming source and drain regions (as described before, since the cross sections are taken along lines extending in the lengthwise direction of the transistor element and therefore the source and drain regions are not shown. In the drawing, the source and drain regions lie behind and before the paper in the transistor region 21). Since the silicide layer 6 is formed in direct contact with the substrate 1, charges caused by the ion-implantation are discharged into the substrate via the silicide layer 6. As a result, almost no charge is stored in the gate electrode layer 12. That is, substantially no gate charge occurs.

After this, the heat treatment is effected to activate implanted As+ so as to form source and drain regions. At this time, As+ implanted into the silicide layer 6 is diffused into the substrate 1 via the contact area between the silicide layer 6 and the substrate 1 to form an n-type diffusion layer 7 in that part of the substrate 1 which corresponds to the contact area 22 as shown in FIG. 1J.

Then, as shown in FIG. 1K, an interlayer insulation film 8 of SiO$_2$, for example, is formed on the entire surface of the resultant structure by the CVD method and is patterned to form an opening which reaches the silicide layer 6.

Next, as shown in FIG. 1L, a metal layer 9 of aluminum, for example, is formed on the entire surface of the resultant structure by the sputtering method and is patterned to form a gate electrode lead-out layer 9.

As is clearly understood from the above embodiment, in the manufacturing method of this invention, the silicide layer 6 is formed in direct contact with the substrate 1 so that charges caused by the ion-implantation may be discharged via the substrate. As a result, unwanted gate charge will not occur.

Further, the polysilicon layer 4 is formed between the gate oxide film 3 and photoresist layer 5 and thus the gate oxide film 3 is not formed in direct contact with the resist layer. Therefore, occurrence of damage to the surface area of the gate oxide film 3 caused when the resist layer 5 is formed in direct contact with the gate oxide film 3 can be prevented a;.d injection of unwanted material from the resist layer into the gate oxide film can also be prevented.

Figure 2A:
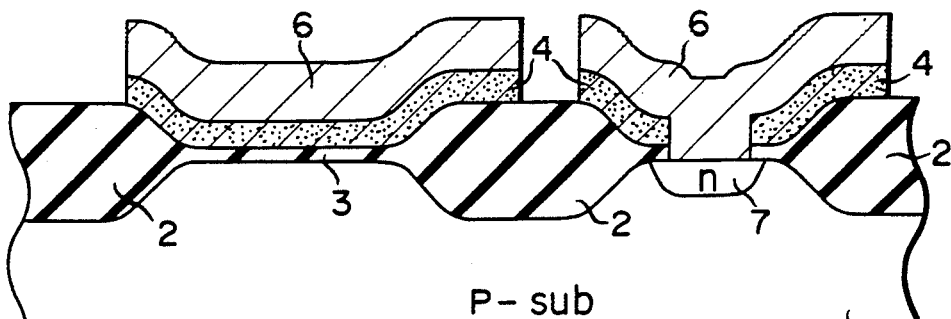
FIGS. 2A to 2C are cross sectional views of semiconductor structures in respective manufacturing steps in a modification of the embodiment explained with reference to FIGS. 1A to 1L.

In a case where the withstanding voltage of the pn junction between the substrate 1 and the n-type diffusion layer 7 is not sufficiently high for the operation of the device, portions of the silicide layer 6 and the polysilicon layer 4 which lie on the element isolation region 2 between the transistor region 21 and the contact area 22 are etched out to isolate an area of the electrode layer 22 acting as the gate electrode from the substrate 1 as shown in FIG. 2A. As a result, the operation voltage of this device will not be limited by the withstanding voltage of the pn junction.

Figure 2B:
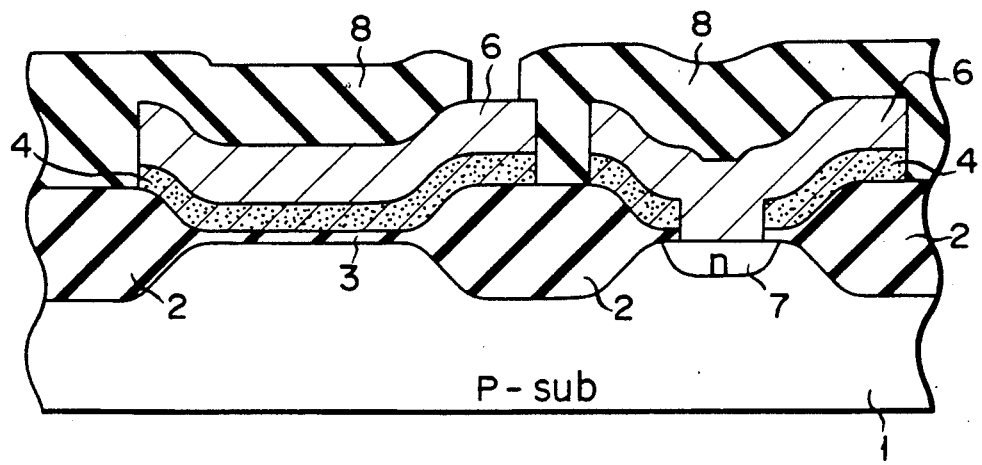
Figure 2C:
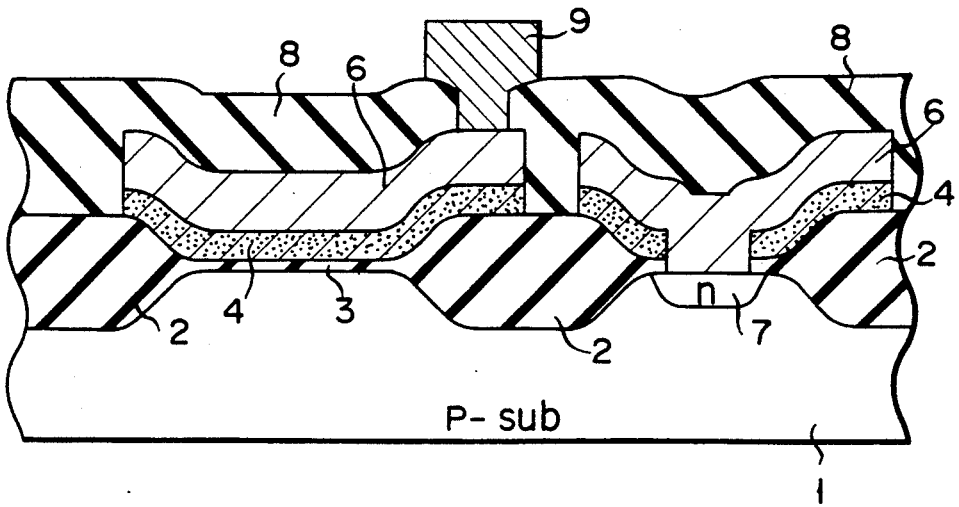

The succeeding manufacturing process is the same as that in the former embodiment. That is, as shown in FIG. 2B, an interlayer insulation film 8 of SiO$_2$, for example, is formed on the entire surface of the resultant structure by the CVD method and is patterned to form an opening which reaches the silicide layer 6. Then, as shown in FIG. 2C, a metal layer 9 of aluminum, for example is formed on the entire surface of the resultant structure by the sputtering method and is patterned to form a gate electrode lead-out layer 9.

If the gate electrode is formed in contact with the substrate at one place, charges can ,e smoothly discharged into the substrate. Therefore, it is extremely advantageous from the viewpoint of effective use of the chip area that the manufacturing method of this invention is used for manufacturing semiconductor devices in which a gate electrode is formed as a continuous layer extending over a plurality of memory cells.

In the former embodiment, a sin(!le-layered gate structure is used. However, a two-layered or multi-layered gate structure can be applied in this invention.

Further, in the former embodiment, the gate electrode layer is formed with the polycide gate structure of the polysilicon layer and WSi layer. However, the silicide layer is not limited to the WSi layer but a MoSi, TiSi layer or the like can be used as the silicide layer. The deposition method of the silicide layer is not limited to the CVD method, and the sputtering method or the like can be used.

Further, it is possible to use an n-type silicon substrate instead of the p-type silicon substrate. In this case, it is necessary to use p-type impurity such as boron (B) as the impurity to be implanted instead of the n-type impurity.

What is claimed is:

1. A method for manufacturing a semiconductor device having a polycide gate structure, comprising the steps of:

forming a gate insulation film on a semiconductor substrate;

forming a polysilicon layer on said gate insulation film;

selectively removing that portion of said polysilicon layer and that portion of said gate insulation film, which are within a contact region separated from a transistor region, to form an opening which reaches said semiconductor substrate to expose a portion of said semiconductor substrate which is within said contact region;

forming a silicide layer in direct contact with said polysilicon layer and said portion of said semiconductor substrate which is exposed by said opening and within said contact region;

patterning said polysilicon layer and said silicide layer to form a polycide gate electrode; and after forming the silicide layer, effecting an ion-implantation to form source and drain regions.

2. A manufacturing method according to claim 1, wherein the step of forming said silicide layer includes a CVD process.

3. A manufacturing method according to claim 1, wherein the step of forming said silicide layer includes a sputtering process.

4. A manufacturing method according to claim 1, wherein said silicide layer is a WSi layer.

5. A manufacturing method according to claim 1, wherein said silicide layer is a MoSi layer.

6. A manufacturing method according to claim 1, wherein said silicide layer is a TiSi layer.

7. A method for manufacturing a semiconductor device having a polycide gate structure, comprising the steps of:

forming a gate insulation film on a semiconductor substrate;

forming a polysilicon layer on said gate insulation film;

selectively removing said polysilicon layer and said gate insulation film to form an opening which reaches said semiconductor substrate;

forming a silicide layer in direct contact with said polysilicon layer and a portion of said semiconductor substrate which is exposed by said opening;

after forming the silicide layer, effecting an ion-implantation to form source and drain regions; and selectively removing said silicide layer and said polysilicon layer to separate an area acting as a polycide age electrode from said semiconductor substrate.

8. A manufacturing method according to claim 7, wherein the step of forming said silicide layer includes a CVD process.

9. A manufacturing method according to claim 7, wherein the step of forming said silicide layer includes a sputtering process.

10. A manufacturing method according to claim 7, wherein said silicide layer is a WSi layer.

11. A manufacturing method according to claim 7, wherein said silicide layer is a MoSi layer.

12. A manufacturing method according to claim 7, wherein said silicide layer is a TiSi layer.

13. A method for manufacturing a semiconductor device having a polycide gate structure, comprising the steps of:

forming a gate insulation film on a semiconductor substrate;

forming a polysilicon layer on said gate insulation film;

selectively removing that portion of said polysilicon layer and that portion of said gate insulation film, which are within a contact region separated from a transistor region, to form an opening which reaches said semiconductor substrate to expose a portion of said semiconductor substrate which is within said contact region;

forming a silicide layer in direct contact with said polysilicon layer and said portion of said semiconductor substrate which is exposed by said opening and within said contact region;

patterning said polysilicon layer and said silicide layer to form a polycide gate electrode;

after forming the silicide layer, effecting an ion-implantation to form source and drain regions; and selectively removing said silicide layer and said polysilicon layer to separate an area acting as a polycide gate electrode from said semiconductor substrate.

14. A manufacturing method according to claim 13, wherein the step of forming said silicide layer includes a CVD process.

15. A manufacturing method according to claim 13, wherein the step of forming said silicide layer includes a sputtering process.

16. A manufacturing method according to claim 13, wherein said silicide layer is a WSi layer.

17. A manufacturing method according to claim 13, wherein said silicide layer is a MoSi layer.

18. A manufacturing method according to claim 13, wherein said silicide layer is a TiSi layer.

* * * * *